(12) United States Patent
Benjamin et al.

(10) Patent No.: US 10,395,901 B2
(45) Date of Patent: Aug. 27, 2019

(54) PLASMA IGNITION AND SUSTAINING APPARATUS

(71) Applicant: Lam Research Corporation, Fremont, CA (US)

(72) Inventors: Neil Martin Paul Benjamin, Palo Alto, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 702 days.

(21) Appl. No.: 14/931,672

(22) Filed: Nov. 3, 2015

(65) Prior Publication Data
US 2016/0056023 A1    Feb. 25, 2016

Related U.S. Application Data

(63) Continuation of application No. 12/908,459, filed on Oct. 20, 2010, now Pat. No. 9,174,296.

(51) Int. Cl.
*H01J 37/32* (2006.01)
*B23K 9/013* (2006.01)
(Continued)

(52) U.S. Cl.
CPC ........ *H01J 37/32541* (2013.01); *B23K 9/013* (2013.01); *B23K 10/00* (2013.01); *H01J 37/3211* (2013.01); *B23K 2101/40* (2018.08)

(58) Field of Classification Search
CPC . B23K 9/00; B23K 9/09; B23K 9/013; B23K 10/00; B23K 10/003; H01J 37/32; H01J 37/32009; H01J 37/32082
(Continued)

(56) References Cited

U.S. PATENT DOCUMENTS 5,234,529 A    8/1993  Johnson ...................... 156/345
5,285,046 A *  2/1994  Hansz ............... H01J 37/32165
                                              219/121.47
(Continued)

FOREIGN PATENT DOCUMENTS

JP    5-217693 A    8/1993   ............... H05H 1/30
JP    H0850996 A   2/1996   ............... H05H 1/46

OTHER PUBLICATIONS

KR Application No. 10-2013-7010130, Office Action dated Jul. 7, 2017, 5 pages.
(Continued)

*Primary Examiner* — Dana Ross
*Assistant Examiner* — Ayub A Maye
(74) *Attorney, Agent, or Firm* — Penilla IP, APC

(57) ABSTRACT

Apparatus for use with a vessel used to generate plasma are provided. One apparatus includes a first comb structure configured to partially wrap around a circumference of the vessel. The first comb structure has a first end and a second end, and a first separation is defined between the first end and the second end. The first comb structure defines a first plurality of fingers oriented perpendicular to the circumference of the vessel. The first comb structure is configured to be connected to a first end of a radio frequency (RF) coil. Also provided is a second comb structure configured to partially wrap around the circumference of the vessel. The second comb structure has a first end and a second end. A second separation is defined between the first end and the second end the second comb structure. The second comb structure defines a second plurality of fingers oriented perpendicular to the circumference of the vessel. The second comb structure is configured to be connected to a second end of the RF coil. Further, ends of the first plurality of fingers
(Continued)

and ends of the second plurality of fingers are configured to face each other and maintain a third separation.

18 Claims, 2 Drawing Sheets

(51) Int. Cl.
*B23K 10/00* (2006.01)
*B23K 101/40* (2006.01)

(58) Field of Classification Search
USPC ........................................ 219/121.43, 36, 48
See application file for complete search history.

(56) References Cited

U.S. PATENT DOCUMENTS

| | | | | |
|---|---|---|---|---|
| 5,334,834 | A | 8/1994 | Ito et al. ........................ | 250/288 |
| 5,903,106 | A * | 5/1999 | Young ................... | H01J 37/321 |
| | | | | 315/111.41 |
| 6,264,812 | B1 | 7/2001 | Raaijmakers et al. ... | 204/298.06 |
| 6,410,880 | B1 * | 6/2002 | Putvinski ................. | H05H 1/30 |
| | | | | 219/121.48 |
| 6,459,066 | B1 | 10/2002 | Khater et al. ............ | 219/121.41 |
| 6,499,424 | B2 * | 12/2002 | Kazumi ............ | H01J 37/32009 |
| | | | | 118/723 I |
| 6,696,662 | B2 * | 2/2004 | Jewett ............... | H01J 37/32009 |
| | | | | 118/723 MW |
| 6,740,842 | B2 * | 5/2004 | Johnson ................. | H01J 37/321 |
| | | | | 118/723 I |
| 6,809,036 | B2 * | 10/2004 | Liu .......................... | G03F 7/265 |
| | | | | 438/425 |
| 7,404,879 | B2 * | 7/2008 | Tolmachev ........... | C23C 14/358 |
| | | | | 118/715 |
| 8,324,523 | B2 * | 12/2012 | Foret ..................... | B01J 19/126 |
| | | | | 110/245 |
| 8,981,250 | B2 * | 3/2015 | Foret ..................... | A23B 4/015 |
| | | | | 110/246 |
| 2002/0023899 | A1 | 2/2002 | Khater et al. ............ | 219/121.41 |
| 2002/0100751 | A1 | 8/2002 | Carr | |

OTHER PUBLICATIONS

Chinese App. No. 201510937447.6, Office Action 200433, issued by Chinese Patent Office, dated Jul. 3, 2017.

Taiwan App. No. 100137590, Search Report, TIPO Taiwanese Patent Network, dated Mar. 3, 2016.

Taiwan App. No. 100137590, Search Report, from Notification of Examination Opinions, issued by Taiwanese IPO dated Aug. 1, 2016.

* cited by examiner

PLASMA IGNITION AND SUSTAINING APPARATUS

CLAIM OF PRIORITY

This application is a Continuation application of U.S. application Ser. No. 12/908,459, filed on Oct. 20, 2010, entitled "Plasma Ignition and Sustaining Methods and Apparatuses", of which is incorporated herein by reference.

BACKGROUND

In the manufacture of semiconductor products, substrates such as wafers undergo deposition and etching processes to form features thereon. The processing of semiconductor substrates often leaves residues, such as polymer deposition, between processing steps. Atmospheric inductively coupled plasma torches have been employed to clean substrates in preparation for further processing.

To facilitate discussion, FIG. 1 shows a typical prior art atmospheric inductively coupled plasma torch 100, which includes a double-wall cylinder 102. Cylinder 102 is typically formed out of quarts or a similarly suitable material. A cooling gas inlet 104 permits a cooling gas, such as nitrogen or air for example, to be injected in between the cylinder walls to thermally regulate double-wall cylinder 102 during use. By employing an appropriate cooling gas, thermal damage to atmospheric inductively coupled plasma torch 100 due to the high heat dissipation from the plasma therein is prevented.

A coil 106 is shown wrapped around the outer periphery of double-wall cylinder 102. During use, a process gas (e.g., hydrogen or nitrogen) is introduced into the interior volume of cylinder 102 through process gas inlet 108. When an appropriate driver RF signal (e.g., at 40 MHz) is supplied to coil 106, coil 106 acts as part of a series LC resonance circuit to ignite a plasma from the process gas. To help cool coil 106 during use, the coil is designed as a tube allowing liquid cooling to flow through it.

The inductively coupled plasma formed within atmospheric inductively coupled plasma torch 100 is ejected from opening 120. The hot jet of plasma ejected from opening 120 may then be employed to remove or clean materials, such as unwanted polymer deposition after an ion implantation process, from substrates.

As is known, the induced voltage across coil 106 is a function of the frequency of the driver RF signal. At 40 MHz, a typical atmospheric inductively coupled plasma torch may experience up to 20 KV (peak-to-peak) between the ends of coil 106, for example. The high induced voltage is necessary for igniting plasma at typical atmospheric conditions.

However, the high RF driver frequency employed in the prior art (e.g., 40 MHz or higher) presents cost and engineering challenges. For example, many processing systems already employ lower-frequency RF sources (e.g., 10-30 MHz, such as 13.56 MHz or 27.12 MHz) for etching and deposition. Accordingly, components and expertise for designing, manufacturing, qualifying, and maintaining lower-frequency subsystems are readily available at lower cost. Further, tool-to-tool repeatability is improved when a lower driver RF frequency is employed.

The invention relates to methods and apparatus for improving plasma ignition in an atmospheric inductively coupled plasma torch in particular and in inductively coupled plasma tools in general.

SUMMARY

An apparatus for use with a vessel used to generate plasma is provided. One example apparatus includes a first comb structure configured to partially wrap around a circumference of the vessel. The first comb structure has a first end and a second end, and a first separation is defined between the first end and the second end. The first comb structure defines a first plurality of fingers oriented perpendicular to the circumference of the vessel. The first comb structure is configured to be connected to a first end of a radio frequency (RF) coil. Also provided is a second comb structure configured to partially wrap around the circumference of the vessel. The second comb structure has a first end and a second end. A second separation is defined between the first end and the second end the second comb structure. The second comb structure defines a second plurality of fingers oriented perpendicular to the circumference of the vessel. The second comb structure is configured to be connected to a second end of the RF coil. Further, ends of the first plurality of fingers and ends of the second plurality of fingers are configured to face each other and maintain a third separation.

In one implementation, the first comb structure and the second comb structure are disposed at first radius outside of the vessel, and said coil is disposed at a second radius that is outside of the first radius.

In one implementation, the second end of the said coil is coupled to ground.

In one implementation, said coil is configured to produce magnetic field lines around the first and second comb structures and around the vessel.

In one implementation, said vessel has a longitudinal axis and the first comb structure and the second comb structure are aligned outside of the vessel and along the longitudinal axis.

In one implementation, said RF driver signal has a frequency between about 10 MHz to about 100 MHz.

In one implementation, the coil is configured as a wound coil around the vessel, and the coil has a coil length between the first end and the second end.

In one implementation, each finger of said first plurality of fingers is separated from an adjacent finger, and each finger of said second plurality of fingers is separated from an adjacent finger.

In one implementation, the first and second comb structures are defined from a conductive material.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Generally speaking plasma ignition is dependent on the strength of the electric field that is applied across a given gas column. In the more specific case of a solenoid coil, ignition is dependent on the strength of the electric field inside the solenoid.

The electric field is generally governed by equation 1 below.

$$E = V/L \qquad \text{Eq. 1}$$

whereby V is the induced voltage between the coil ends, E is the strength of the electric field, and L is the length of the coil. It should be noted that by 'L, length of the coil' we mean the length of the coil solenoid and not the length of the wire that is used to wind the coil.

The inventors herein realize that if the effective length of the coil L can be reduced, a stronger electric field E can be obtained for the same induced voltage on the coil. Alternatively or additionally, if the induced voltage V is reduced (due to, for example, a reduction in the driver RF frequency), an electric field that is capable of satisfactorily igniting the plasma may still be created by lowering the effective length of the coil.

In one or more embodiments, there are provided partially enclosing, longitudinally oriented conductive (PELOC) fingers that effectively reduce the effective length of the coil. The PELOC fingers, as the name implies, are conductive strips or prongs or teeth or protrusions (referred to herein generically as "fingers") of conductive materials that are disposed outside of the quartz cylinder and are oriented along the longitudinal axis of the quartz cylinder of the atmospheric inductively coupled plasma torch. Two sets of fingers are provided, with each set of fingers connected to a different coil end. The fingers of each set are disposed longitudinally with respect to the cylinder as well with the fingers of the first set pointing toward the second set (and vice versa) in a spatially separated manner. Embodiments of the invention also relate to techniques for manufacturing, provisioning, operating and maintaining these enhancements for an atmospheric inductively coupled plasma torch.

Figure 1:
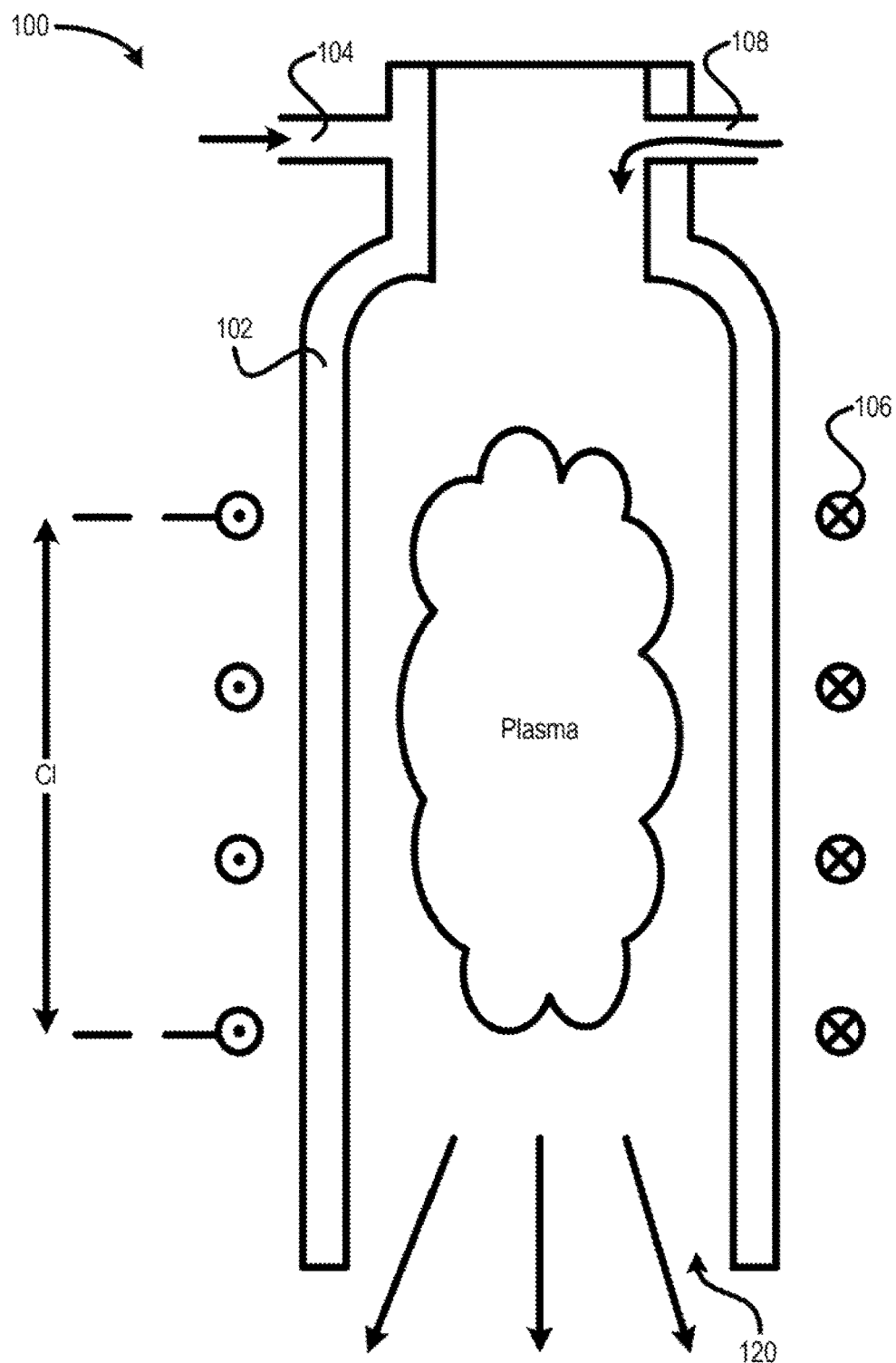
FIG. 1 shows a typical prior art atmospheric inductively coupled plasma torch.
Figure 2:
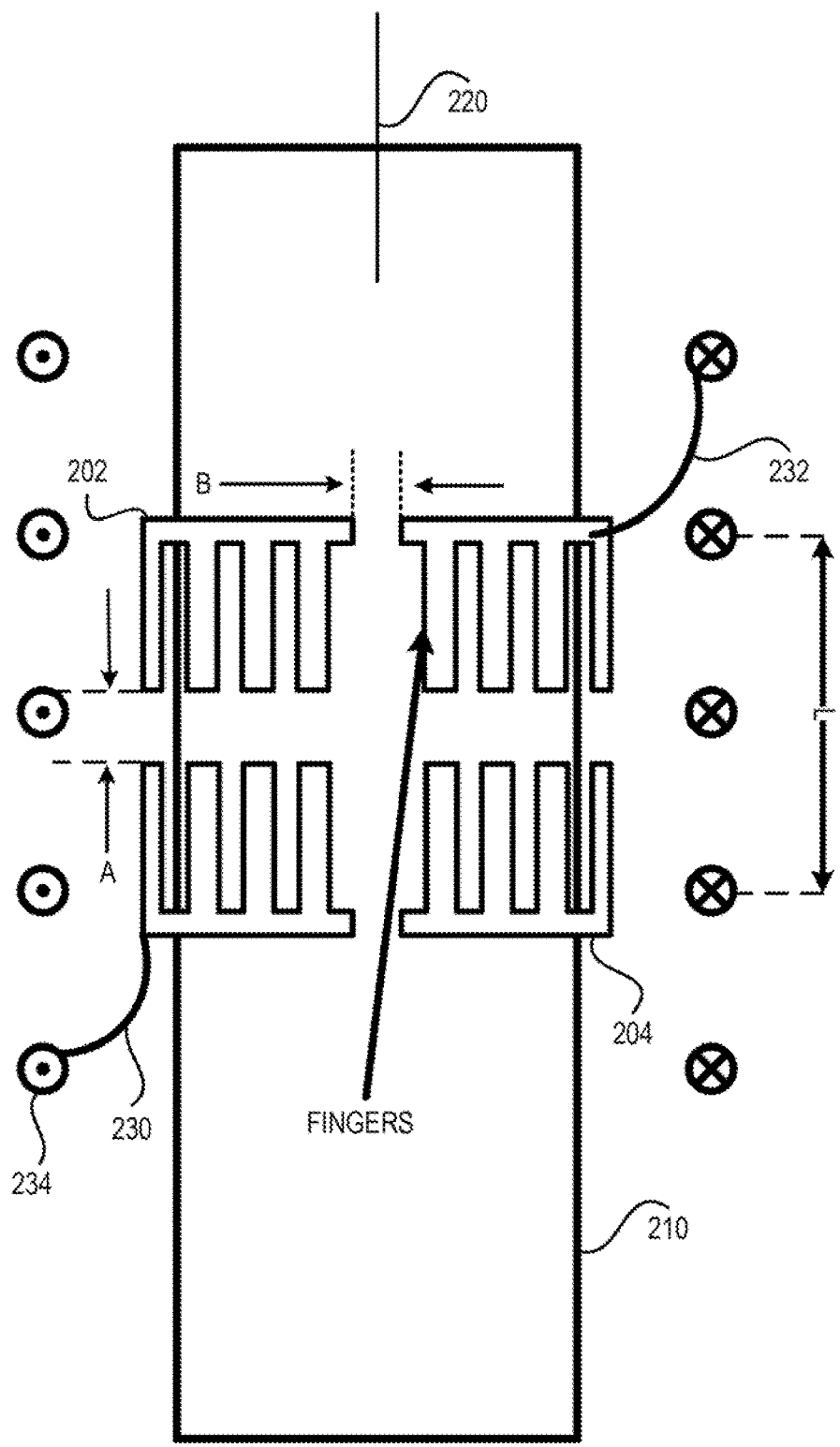
FIG. 2 shows, in accordance with an embodiment of the invention, an implementation of the present invention.

FIG. 2 shows, in accordance with an embodiment of the invention, an example configuration in which the conductive fingers of PELOC finger set 202 are disposed longitudinally with respect to longitudinal axis 220 of cylinder 210. Likewise, the conductive fingers of PELOC finger set 204 are disposed longitudinally with respect to the longitudinal axis 220 of cylinder 210. The PELOC finger set 202 and PELOC finger set 204 are arranged such that fingertips of PELOC finger set 202 point in the direction toward fingertips of PELOC finger set 204. As can be shown, the conductive fingers of PELOC finger set 202 and the conductive fingers of PELOC finger set 204 are spatially separated by a set-to-set gap A along the longitudinal axis 220 of cylinder 210.

The conductive fingers of PELOC finger set 202 only partially enclose the periphery of cylinder 210, resulting in an intra-set gap B as shown. Likewise, the conductive fingers of PELOC finger set 204 only partially enclose the periphery of cylinder 210 resulting in an intra-set gap C as shown. These features and gaps are discussed in greater details hereinbelow.

By using longitudinally-oriented conductive fingers in the manners described herein magnetic field lines emanating from the coil are allowed to advance further inward and penetrate thru the quartz tube 210 to induce a circulating current sustaining plasma inside of the torch. This is possible as the fingers mentioned above are oriented essentially parallel to the direction of the magnetic field lines. The intra-set gap B substantially reduces the occurrence of circulating currents in the base of the PELOC fingers which would needlessly consume power as it would generate current heating inside the PELOC fingers. If the longitudinally-oriented conductive fingers of each finger set had been replaced by a same-size solid conductive band, undesirable circulating currents would have formed in the solid conductive bands. Further, the use of longitudinally-oriented conductive fingers in the manners described herein-reduces the physical distance over which the coil voltage drops from L, the length of the coil to A, the inter-set gap. This reduction in length increases the electric field strength approximately by the ratio L/A for a given induced voltage. Because of this, plasma ignition may be enabled with a lesser induced voltage across the coil.

As mentioned, each set of PELOC fingers is coupled to a different coil end (via leads 230 and 232 in FIG. 2 for example) and the greater proximity A of the finger tips to each other as compared to L, the coil length is there to reduce the physical distance over which the coil voltage drops (a five-turn coil of length L is shown in FIG. 2 as an example). Again, this is the case since the sets of PELOC fingers are disposed closer together in a partially enclosing manner outside the cylinder. Set-to-set gap A (the terms "set-to-set" or "inter-set" denotes the finger-tip-to-finger-tip gap from one set of fingers to another set of fingers along the longitudinal axis of the cylinder) is preferably as small as possible to minimize this effective coil length. However, generally speaking, set-to-set gap A should not be so small as to cause arcing to occur between fingers of PELOC finger set 202 and fingers of PELOC finger set 204. Further, set-to-set gap A should also not be so small as to cause undesired plasma formation outside of the cylinder to occur between fingers of PELOC finger set 202 and fingers of PELOC finger set 204.

In an embodiment, an empirical method is employed to determine the size of set-to-set gap A for a particular torch. Initially, the two PELOC finger sets are partially wrapped around the cylinder and lined up along the longitudinal axis of the cylinder. At this point, the finger sets are positioned such that they are far apart from one another while still satisfying form factor constraints imposed by the size of the cylinder and while still being capable of igniting plasma inside the cylinder (although the large effective length of the coil at this gap distance would require a rather high coil voltage to generate the requisite E field to ignite the plasma). This places an upper limit on the size of set-to-set gap A.

The sets of PELOC fingers are then progressively moved along the longitudinal axis of the chamber toward one another. At some point, set-to-set gap A becomes so small that arcing occurs or the probability of arcing becomes unacceptably high. Further, as set-to-set gap A is made smaller, there is a risk that plasma ignition of ambient air may occur if the electric field set up in set-to-set gap A is high enough. Such uncontrolled plasma ignition of ambient air outside the cylinder is undesirable. The smallest set-to-set gap A that does not allow arcing or undesired ambient air ignition to occur establishes a lower bound on the size of set-to-set gap A.

The window in between the established upper bound and lower bound of set-to-set gap A is a suitable operating window. In a preferred embodiment, set-to-set gap A is set to be as small as possible as long as arcing or unwanted outside-the-cylinder plasma ignition is prevented. This minimum gap distance for set-to-set gap A ensures that the effective length of the coil is kept to a minimum while ensuring that arcing or unwanted plasma ignition will not occur.

Preferably, all the fingers of any one set of PELOC fingers are electrically coupled to one another. For each set of PELOC fingers, the individual fingers, while being electrically interconnected, are aligned longitudinally along the longitudinal axis of the cylinder as discussed earlier. An intra-set gap B (see FIG. 2) is provided such that the fingers of each PELOC set of fingers only partially enclose the outer circumference or outer periphery (if the cylinder is not round, for example) of the cylinder. This gap, referred to herein as an "intra-set" gap, specifies the dimension of the break made among the electrically connected fingers of a PELOC finger set in order to implement the "partially enclosing" feature.

The presence of intra-set gap B ensures that recirculating currents are minimized among fingers of each set of PELOC fingers. The dimension of intra-set gap B is designed with analogous considerations (e.g., arcing avoidance) as the design for set-to-set gap A. In one or more embodiments, intra-set gap B is preferably as small as possible to minimize non-uniformity in the generated electric field and induced magnetic field. Such non-uniformity may possibly affect the uniformity of the generated plasma and is minimized to the extent possible, in one or more embodiments of the invention.

In an embodiment, a strip of conductive material or conductive "spine" is provided to electrically and structurally connect the fingers of each set of PELOC fingers together. Each of the two "spines" is then connected to one of the coil ends (labeled 230 and 232 in FIG. 2). In this configuration, the fingers resemble teeth of a comb. One may visualize the two sets of PELOC fingers in this configuration, when disposed around the cylinder of an atmospheric inductively coupled plasma torch, as two combs with their teeth facing one another and separated teeth-tips-to-teeth-tips by a set-to-set gap. Each "comb" partially wraps around the cylinder of the atmospheric inductively coupled plasma torch such that there exists an intra-set gap where the two comb ends of the comb do not meet due to the partially enclosing feature but are rather separated by gap B. The comb implementation may be seen in FIG. 2, for example.

Generally speaking, the fingers may be made as slender or long/short as desired since the gaps between adjacent fingers allow the induced magnetic field to penetrate into the cylinder to reach the plasma therein. The conductive finger material may be copper, copper alloy, or a similarly suitable material. The coils for generating the electro-magnetic field may be disposed outside of the fingers (i.e., at a greater radius distance from the center longitudinal axis of the cylinder). A sufficient number of fingers should be provided in each 'comb' and spaced equal distance around the circumference of the quartz cylinder to avoid azimuthal non-uniformities in the applied electro-magnetic field. The conductive fingers need to be wide enough to be mechanically stable but, generally speaking, should be kept narrower than the width of the gap between them to allow as many magnetic field lines from the coil as possible to advance to the inside of the quartz cylinder (a metal finger itself will be opaque to a time-varying magnetic field—only a gap allows the field to advance further inward. The magnetic field lines emanating from the coil are responsible for sustaining plasma inside the quartz tube). Generally speaking, the PELOC fingers are believed to contribute primarily to plasma ignition. Sustaining the plasma is believed to be driven primarily by the coil. Consequently, plasma uniformity tends to depend on how uniform the winding pitch of the coil is and how well the coil is coaxially aligned with the quartz cylinder.

In one or more embodiments, if a very low RF driver frequency is desired or if a very low induced coil voltage is desired, the techniques and apparatuses disclosed herein may be combined with the novel coil winding techniques and apparatuses of a commonly-owned patent application entitled "METHODS AND APPARATUS FOR IGNITING AND SUSTAINING PLASMA", filed on even date herewith by the same inventors herein, (U.S. patent application Ser. No. 12/908,462, now U.S. Pat. No. 8,884,178, issued on Nov. 11, 2014), and incorporated by reference for all purposes.

By combining the present techniques/apparatuses that shorten the effective length of the coil with techniques/apparatuses that increase the coil's inductance via an increase in the number of coil turns, it is possible to generate an electric field that is capable of igniting a plasma inside the cylinder with a very low RF driver frequency and/or with a very low induced coil voltage. It is envisioned that induced coil voltages in the range of some thousands of volts may be adequate to ignite the plasma inside the cylinder, in some embodiments. These two techniques advantageously manipulate different mechanisms for electric field generation in an atmospheric inductively coupled plasma torch and do not interfere with one another. The combined techniques and apparatuses represent unique innovations, in one or more embodiments.

As can be appreciated from the foregoing, embodiments of the invention enhance the utilization of the plasma-igniting electro-magnetic field in an atmospheric inductively coupled plasma torch. With the techniques and apparatuses disclosed herein, plasma ignition in an atmospheric inductively coupled plasma torch is possible even if the induced coil voltage is lowered, e.g., due to the lowering of the driver RF frequency for example. When the required induced coil voltage and/or driver RF frequency is reduced, RF generators as well as components for the atmospheric inductively coupled plasma torch may be made more inexpensively and may be matched system-to-system with greater ease, contributing to lower production cost for semiconductor products.

It should be kept in mind also that while these techniques/apparatuses are discussed in connection with atmospheric inductively coupled plasma torches, it is contemplated that the same techniques and apparatuses may be employed to improve plasma ignition and sustaining in other inductively coupled plasma tools and chambers. Having disclosed exemplary embodiments and the best mode, modifications and variations may be made to the disclosed embodiments while remaining within the subject and spirit of the invention as defined by the following claims.

The invention claimed is:

1. An apparatus for generating a plasma in a vessel, comprising,
a first comb structure configured to partially encircle a circumference of the vessel used to generate the plasma, the first comb structure having a first end and a second end, such that a first separation distance is defined between the first end and the second end, the first comb structure defining a first plurality of fingers oriented perpendicular to the circumference of the vessel, and wherein the first comb structure is configured to be connected to a first end of a coil that is configured to receive an radio frequency (RF) driver signal for generating the plasma in the vessel; and a second comb structure configured to partially encircle the circumference of the vessel, the second comb structure having a first end and a second end, such that a second separation distance is defined between the first end and the second end of the second comb structure, the second comb structure defining a second plurality of fingers oriented perpendicular to the circumference of the vessel, and wherein the second comb structure is configured to be connected to a second end of the coil;

wherein the first plurality of fingers of the first comb structure are further oriented to face the second plurality of fingers of the second comb structure;

wherein a gap is defined between ends of the first and second plurality of fingers.

2. The apparatus of claim 1, wherein the first comb structure and the second comb structure are disposed at first radius outside of the vessel, and said coil is disposed at a second radius that is outside of the first radius.

3. The apparatus of claim 1, wherein the second end of the said coil is coupled to ground.

4. The apparatus of claim 1, wherein said coil is configured to produce magnetic field lines around the first and second comb structures and around the vessel.

5. The apparatus of claim 1, wherein said vessel has a longitudinal axis and the first comb structure and the second comb structure are aligned outside of the vessel and along the longitudinal axis.

6. The apparatus of claim 1, wherein said RF driver signal has a frequency between about 10 MHz to about 100 MHz.

7. The apparatus of claim 1, wherein the coil is configured as a wound coil around the vessel, and the coil has a coil length between the first end and the second end.

8. The apparatus of claim 1, wherein each finger of said first plurality of fingers is separated from an adjacent finger, and each finger of said second plurality of fingers is separated from an adjacent finger.

9. The apparatus of claim 1, wherein the first and second comb structures are defined from a conductive material.

10. An apparatus for use with a vessel used to generate plasma, comprising, a first comb structure configured to partially wrap around a circumference of the vessel, the first comb structure having a first end and a second end, and a first separation is defined between the first end and the second end, the first comb structure defining a first plurality of fingers oriented perpendicular to the circumference of the vessel, and wherein the first comb structure is configured to be connected to a first end of a radio frequency (RF) coil used for generating the plasma in the vessel; and a second comb structure configured to partially wrap around the circumference of the vessel, the second comb structure having a first end and a second end, and a second separation is defined between the first end and the second end the second comb structure, the second comb structure defining a second plurality of fingers oriented perpendicular to the circumference of the vessel, and wherein the second comb structure is configured to be connected to a second end of the RF coil used for generating the plasma in the vessel;

wherein a gap is present between ends of the first plurality of fingers and ends of the second plurality of fingers, and said first plurality of fingers and said second plurality of fingers are configured to face each other.

11. The apparatus of claim 10, wherein the first comb structure and the second comb structure are disposed at first radius outside of the vessel, and said RF coil is disposed at a second radius that is outside of the first radius.

12. The apparatus of claim 10, wherein the second end of the said RF coil is coupled to ground.

13. The apparatus of claim 10, wherein said RF coil is configured to produce magnetic field lines around the first and second comb structures and around the vessel.

14. The apparatus of claim 10, wherein said vessel has a longitudinal axis and the first comb structure and the second comb structure are aligned outside of the vessel and along the longitudinal axis.

15. The apparatus of claim 10, wherein an RF driver signal having a frequency between about 10 MHz to about 100 MHz is provided to the first end of the RF coil.

16. The apparatus of claim 10, wherein the RF coil is configured as a wound coil around the vessel, and the RF coil has a coil length between the first end and the second end.

17. The apparatus of claim 10, wherein each finger of said first plurality of fingers is separated from an adjacent finger, and each finger of said second plurality of fingers is separated from an adjacent finger.

18. The apparatus of claim 10, wherein the first and second comb structures are defined from a conductive material.

* * * * *